(12) United States Patent
Kim

(10) Patent No.: US 9,443,603 B2
(45) Date of Patent: Sep. 13, 2016

(54) STORAGE DEVICE AND RELATED METHODS USING TIMER SETTING

(71) Applicant: Young Bong Kim, Seoul (KR)

(72) Inventor: Young Bong Kim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 15 days.

(21) Appl. No.: 14/635,733

(22) Filed: Mar. 2, 2015

(65) Prior Publication Data

US 2015/0262697 A1 Sep. 17, 2015

(30) Foreign Application Priority Data

Mar. 14, 2014 (KR) ........................ 10-2014-0030272

(51) Int. Cl.
| | | |
|---|---|---|
| *G06F 12/00* | (2006.01) |
| *G11C 16/32* | (2006.01) |
| *G06F 12/02* | (2006.01) |
| *G06F 1/08* | (2006.01) |
| *G11C 16/30* | (2006.01) |
| *G11C 16/04* | (2006.01) |

(52) U.S. Cl.
CPC ............... *G11C 16/32* (2013.01); *G06F 1/08* (2013.01); *G06F 12/0246* (2013.01); *G06F 2212/7209* (2013.01); *G11C 16/0483* (2013.01); *G11C 16/30* (2013.01)

(58) Field of Classification Search
CPC ... G11C 16/32; G11C 16/30; G11C 16/0483; G06F 12/0246; G06F 1/08; G06F 2212/7209
See application file for complete search history.

(56) References Cited

U.S. PATENT DOCUMENTS

| | | |
|---|---|---|
| 7,289,348 B2 | 10/2007 | Chen |
| 7,649,776 B2 | 1/2010 | Abiko et al. |
| 7,653,779 B1 | 1/2010 | Fein et al. |
| 7,679,133 B2 | 3/2010 | Son et al. |
| 7,746,702 B2 | 6/2010 | Cho et al. |
| 8,245,101 B2 | 8/2012 | Olbrich et al. |
| 8,248,856 B2 | 8/2012 | Goss et al. |
| 8,553,466 B2 | 10/2013 | Han et al. |
| 8,559,235 B2 | 10/2013 | Yoon et al. |
| 8,644,099 B2 | 2/2014 | Cometti et al. |
| 8,654,587 B2 | 2/2014 | Yoon et al. |
| 2011/0233648 A1 | 9/2011 | Seol et al. |
| 2012/0239991 A1 | 9/2012 | Melik-Martirosian |
| 2012/0268994 A1 | 10/2012 | Nagashima |
| 2012/0294104 A1 | 11/2012 | Mun et al. |
| 2013/0173854 A1 | 7/2013 | Shim et al. |
| 2013/0185612 A1 | 7/2013 | Lee et al. |
| 2014/0146603 A1* | 5/2014 | Shin ....................... G11C 5/143 365/171 |

* cited by examiner

*Primary Examiner* — John Lane
(74) *Attorney, Agent, or Firm* — Volentine & Whitt, PLLC

(57) ABSTRACT

A storage device comprises at least one nonvolatile memory device and a memory controller configured to control the at least one nonvolatile memory device. The storage device searches for a read voltage for at least one memory cell in at least one page when power is turned on following a power-off state, calculates an off-time corresponding to the searched read voltage using a voltage-to-time lookup table, and sets a timer of the storage device using a time stamp corresponding to a page programmed before the power-off, and the off-time.

20 Claims, 18 Drawing Sheets

STORAGE DEVICE AND RELATED METHODS USING TIMER SETTING

CROSS-REFERENCE TO RELATED APPLICATIONS

This application claims priority under 35 U.S.C. §119 to Korean Patent Application No. 10-2014-0030272 filed Mar. 14, 2014, the subject matter of which is hereby incorporated by reference.

BACKGROUND OF THE INVENTION

The inventive concept relates generally to storage devices, and more particularly to storage devices and methods using timer setting.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include read only memory (ROM), magnetoresistive random access memory (MRAM), resistive random access memory (RRAM), and flash memory.

Flash memory is an especially popular form of nonvolatile memory due to attractive features such as relatively high storage density, efficient performance, low cost per bit, and an ability to withstand physical shock. Flash memory and other forms of nonvolatile memory are currently used to store user data, program, and microcode, in a wide variety of applications such as computers, avionics, telecommunications, and consumer electronics industries, to name but a few.

SUMMARY OF THE INVENTION

In one embodiment of the inventive concept, a method is provided for operating a storage device comprising at least one nonvolatile memory device and a memory controller configured to control the at least one nonvolatile memory device. The method comprises searching for a read voltage for at least one memory cell in at least one page when power is turned on following a power-off state, calculating an off-time corresponding to the searched read voltage using a voltage-to-time lookup table, and setting a timer of the storage device using a time stamp corresponding to a page programmed before the power-off, and the off-time.

In another embodiment of the inventive concept, a storage device and a memory controller. The storage device comprises at least one nonvolatile memory device comprising multiple memory blocks each comprising multiple strings disposed in a direction perpendicular to a substrate and connected to a bit line, each string comprising at least one string selection transistor, multiple memory cells, and at least one ground selection transistor, wherein the at least one nonvolatile memory device stores a time stamp registering a global time in a program operation and uses the time stamp to set a desired read voltage in a read operation. The memory controller is configured to control the at least one nonvolatile memory device and comprising a timer used to generate the global time. The timer generates the global time using a time stamp corresponding to a page programmed before a power-off state and an off-time corresponding to a variation in a read voltage until a power is turned on after the power-off state. A relationship between the variation in the read voltage and the off-time is stored in a voltage-to-time lookup table.

In another embodiment of the inventive concept, a method is provide for programming a storage device comprising at least one nonvolatile memory device and a memory controller controlling the at least one nonvolatile memory device. The method comprises receiving a program request, determining whether to set a timer, and as a consequence of determining to set the timer, setting the timer using a voltage-to-time lookup table and a read voltage when it is necessary to set a timer. The method further comprises performing a program operation according to the program request while updating a global time generated from the timer as a time stamp. The global time comprises an off-time corresponding to a variation in the read voltage until a power is turned on after a power-off.

In still another embodiment of the inventive concept, a method is provided for reading a storage device comprising at least one nonvolatile memory device and a memory controller configured to control the at least one nonvolatile memory device. The method comprises receiving a read request, setting at least one read voltage using a global time and a time stamp of a read requested page, and performing a read operation on the read requested page according to the set read voltage. The global time comprises an off-time corresponding to a variation in the read voltage until a power is turned on following a power-off state.

In still another embodiment of the inventive concept, a nonvolatile memory device comprises a memory cell array, an address decoder, an input/output circuit, and control logic. The memory cell array comprises multiple memory blocks each comprising multiple strings disposed in a direction perpendicular to a substrate and connected to a bit line, each string comprising at least one string selection transistor, multiple memory cells, and at least one ground selection transistor. The address decoder configured to select one of the memory blocks according to an address. The input/output circuit configured to store program data in a page of the selected memory block in a program operation and read data from the page of the selected memory block in a read operation. The control logic is configured to control the address decoder and the input/output circuit at the program operation or the read operation. The time stamp where a global time is registered is stored in the program operation. The global time comprises an off-time corresponding to a variation in a read voltage until a power is turned on following a power-off state. At least one read voltage is set using the time stamp in the read operation.

These and other embodiments of the inventive concept can potentially improve the reliability of nonvolatile memory devices by performing certain operations in relation to time stamps determined according to a global time.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, the terms "first", "second", "third", etc., may be used to describe various features, but the described features should not be limited by these terms. Rather, these terms are used merely to distinguish one feature from another. Thus, a feature discussed below could be termed a second feature without departing from the teachings of the inventive concept.

Spatially relative terms such as "below", "lower", "under", "above", "upper" and the like, may be used herein for ease of description to describe one feature's relationship to another feature(s) as illustrated in the figures. The spatially relative terms are intended to encompass different orientations of the device in use or operation in addition to the orientation depicted in the figures. For example, if the device in the figures is turned over, features described as "below" or "under" other features would then be oriented "above" the other features. Thus, the terms "below" and "under" can encompass both an orientation of above and below. The device may be otherwise oriented (rotated 90 degrees or at other orientations) and the spatially relative descriptors used herein interpreted accordingly. In addition, where a feature is referred to as being "between" two features, it can be the only layer between the two features, or one or more intervening features may also be present.

The terminology used herein is for the purpose of describing embodiments only and is not intended to limit the inventive concept. As used herein, the singular forms "a", "an" and "the" are intended to include the plural forms as well, unless the context clearly indicates otherwise. Terms such as "comprises" and/or "comprising," when used in this specification, specify the presence of stated features but do not preclude the presence or addition of one or more other features. As used herein, the term "and/or" includes any and all combinations of one or more of the associated listed items. Where a feature is referred to as being "on", "connected to", "coupled to", or "adjacent to" another feature, it can be directly on, connected, coupled, or adjacent to the other element or layer, or intervening features may be present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

Figure 1:
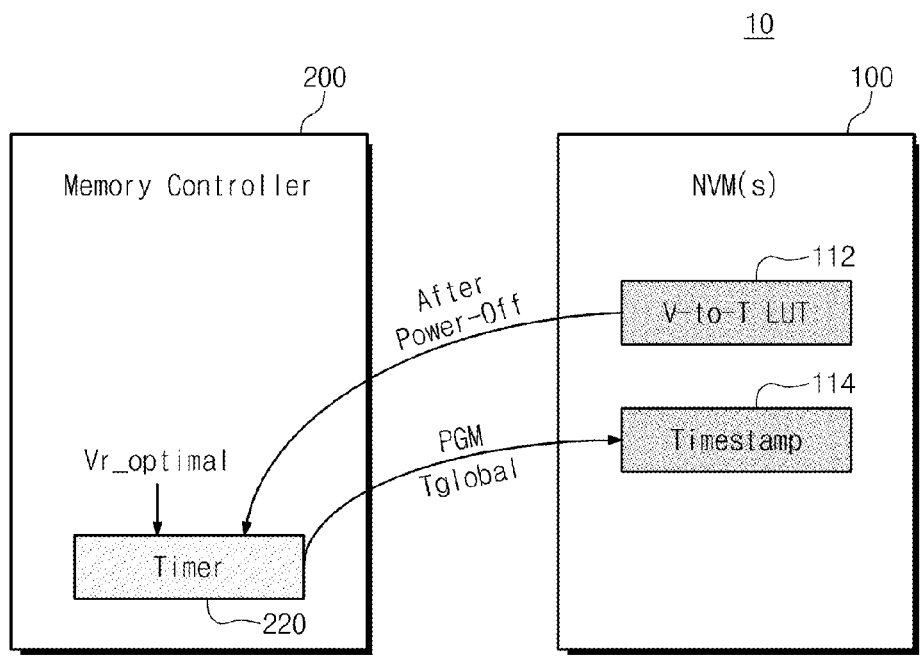
FIG. 1 is a diagram illustrating a storage device according to an embodiment of the inventive concept.

FIG. 1 is a diagram illustrating a storage device 10 according to an embodiment of the inventive concept.

Referring to FIG. 1, storage device 10 incorporates at least one nonvolatile memory device 100 and a memory controller 200 controlling the same.

Nonvolatile memory device 100 may comprise, e.g., a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Nonvolatile memory device 100 may be implemented to have a three-dimensional array structure.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The inventive concept is applicable to a Charge Trap Flash (CTF) memory device, in which a charge storage layer is made up of an insulation film, as well as a flash memory device, in which a charge storage layer is made up of a conductive floating gate. Below, nonvolatile memory device 100 is referred to as a vertical NAND flash memory device (VNAND).

Nonvolatile memory device 100 stores a voltage-to-time lookup table 112 and a time stamp 114. Voltage-to-time lookup table 112 stores information that is associated with a voltage, for example, a desired read voltage Vr_desired and a time corresponding to the voltage. In general, desired read voltage Vr_desired may vary with the lapse of time. Thus, voltage-to-time lookup table 112 exhibits such a characteristic that as desired read voltage Vr_desired decreases, a time corresponding thereto becomes long. However, the inventive concept is not limited thereto.

In embodiments, voltage-to-time lookup table 112 may be configured to store information for different pages. In other embodiments, voltage-to-time lookup table 112 may be configured to store information for different temperature conditions of nonvolatile memory device 100. In still other embodiments, voltage-to-time lookup table 112 may be configured to store information corresponding to at least one of an erase number, a program number, and a read number. Alternatively, voltage-to-time lookup table 112 may be configured to store information corresponding to any feature capable to affecting desired read voltage Vr_desired.

Time stamp 114 comprises a current time when a program operation PGM on at least one page is performed. Here, the current time is a time that is generated and output by a timer 220.

Memory controller 200 controls the at least one nonvolatile memory device 100. Memory controller 200 comprises timer 220. Here, timer 220 may be implemented by software/firmware.

Timer 220 receives time-related information from an external device, and uses the received information to generate/output a current time. For example, timer 220 may produce a current time by counting a system clock. Alternatively, timer 220 may receive time information from an external device and count an internal clock to generate a current time. Here, the internal clock may be produced from an oscillator in storage device 10.

Timer 220 is reset where power is turned off. Where power is turned on, timer 220 sets up a current time newly. For example, after power-on, timer 220 calculates a time corresponding to desired read voltage Vr_desired, using voltage-to-time lookup table 112, and it establishes a current time using the calculated time. Here, the newly established time is referred to as a global time Tglobal or a pseudo absolute time. In the description that follows, a time of timer 220 established by a power-off event is referred to as global time Tglobal.

Desired read voltage Vr_desired may be searched for using a scan read operation on at least one page. For example, a read voltage having a smallest error rate in the scan read operation on at least one page according to a predetermined interval may be set as desired read voltage Vr_desired. Here, the at least one page may be a page that is programmed and has an associated time stamp.

In other embodiments, timer 220 may optionally be activated or reset in response to a user request. Global time Tglobal may therefore be reestablished in response to the user request.

In some storage devices, a time stamp is stored in a program operation, and a desired read voltage is searched for in a read operation using a difference between a stored time and a current time. This may be problematic in that to use a stored time in a read operation may be impossible because a current time is reset after power-off. In contrast, storage device 10 determines the desired read voltage in a read operation using timer 220 that establishes global time Tglobal at power-on, thereby improving the reliability of data.

Figure 2:
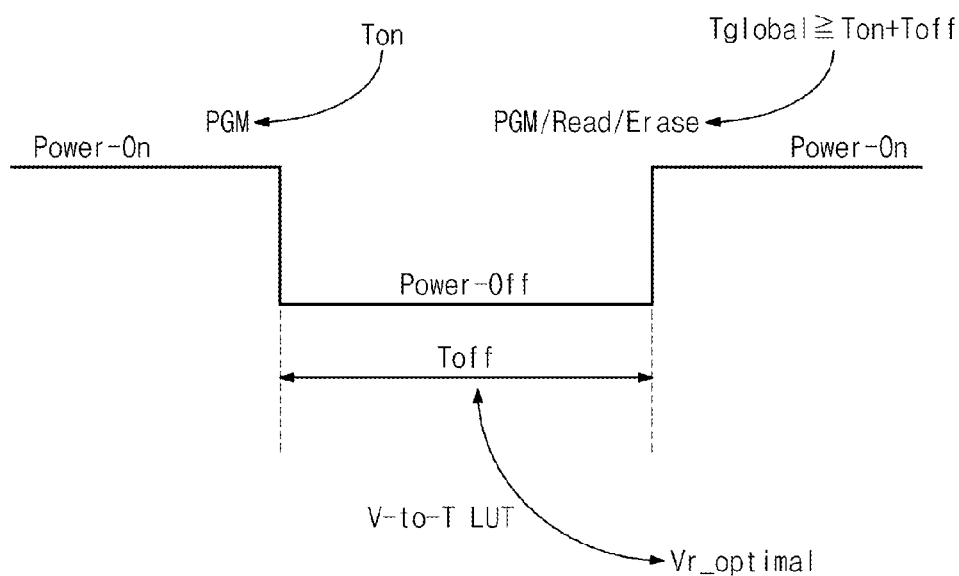
FIG. 2 is a diagram illustrating a global time according to an embodiment of the inventive concept.

FIG. 2 is a diagram illustrating a global time Tglobal according to an embodiment of the inventive concept.

Referring to FIG. 2, global time Tglobal comprises an on-time Ton, which corresponds to a time stamp stored lastly before power-off, and an off-time Toff, which corresponds to a power-off interval. That is, where power is turned on, global time Tglobal may be greater than or equal to a sum of on-time Ton and off-time Toff.

On-time Ton may be a time that corresponds to a page programmed before power-off. On-time Ton may be registered in a time stamp associated with a lastly programmed page.

Timer 220 is reset where storage device 10 is powered off. Once storage device 10 is powered on after a predetermined time, timer 220 is set to a new global time Tglobal. For this, off-time Toff is calculated using desired read voltage Vr_desired and voltage-to-time lookup table 112. For example, when powered on, timer 220 sets to an initial value a sum of a calculated off-time Toff and an on-time Ton registered in a time stamp, and it counts a clock to generate global time Tglobal.

Afterwards, such global time Tglobal may be used (or, registered) in a program operation, an erase operation, or a read operation. Global time Tglobal may generate a time more accurately by calculating and reflecting an off-time Toff corresponding to a voltage variation during a power-off interval.

Figure 3:
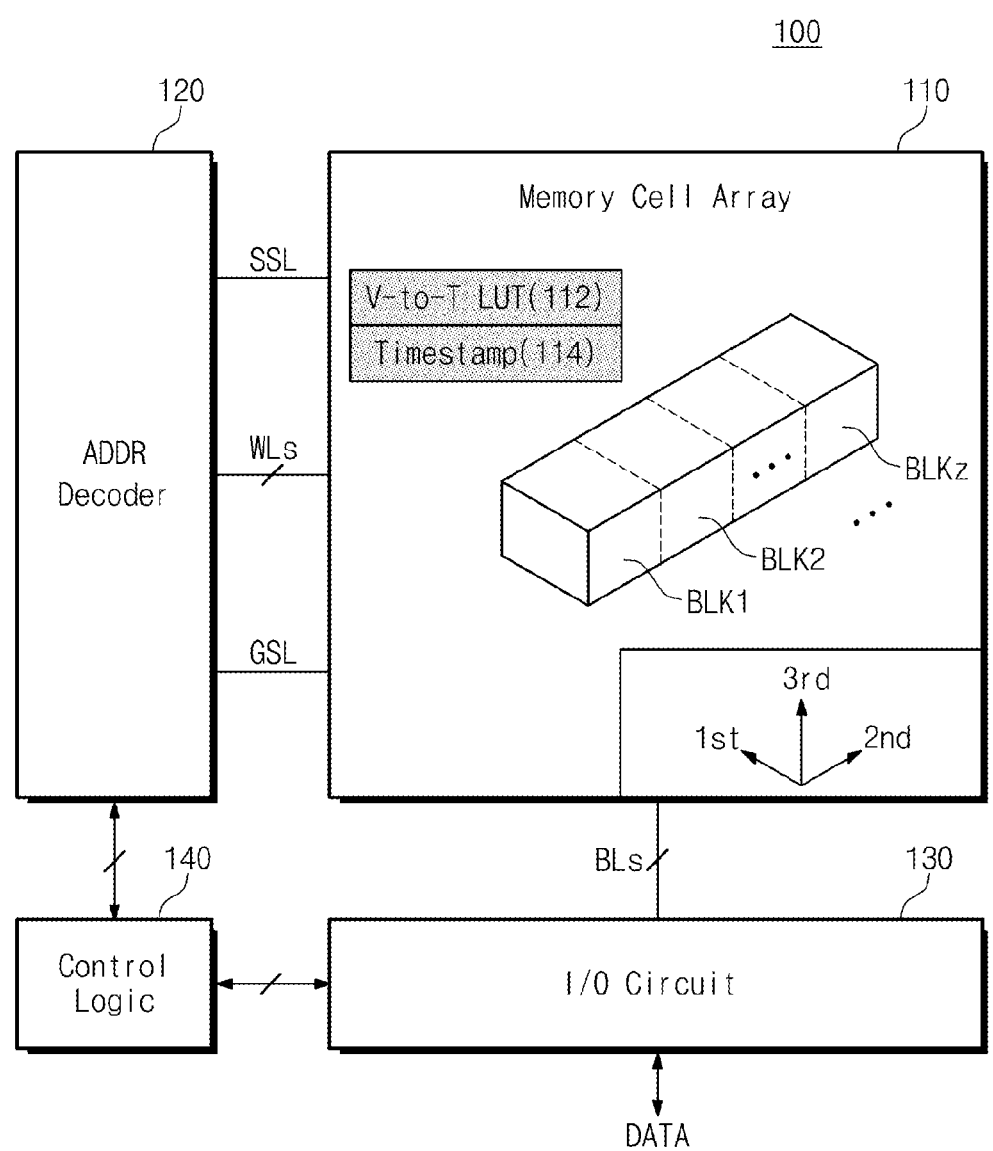
FIG. 3 is a block diagram illustrating a nonvolatile memory device according to an embodiment of the inventive concept.

FIG. 3 is a block diagram illustrating nonvolatile memory device 100 according to an embodiment of the inventive concept.

Referring to FIG. 3, nonvolatile memory device 100 comprises a memory cell array 110, an address decoder 120, an input/output circuit 130, and control logic 140.

Memory cell array 110 is connected to address decoder 120 via word lines, at least one string selection line SSL, and at least one ground selection line GSL. It is connected to input/output circuit 130 via bit lines. Memory cell array 110 comprises multiple memory blocks BLK1 to BLKz (z>1).

Memory blocks BLK1 to BLKz each comprise multiple strings that are three-dimensionally arranged on a substrate along a first direction and a second direction different from the first direction and along a third direction, i.e., a direction perpendicular to a plane formed in the first and second directions. Each string comprises at least one string selection transistor, multiple memory cells, and at least one ground selection transistor connected in series in a direction perpendicular to the substrate. Each memory cell stores one or more bits. At least one dummy cell may be provided between at least one string selection transistor and multiple memory cells. As another example, at least one dummy cell may be provided between multiple memory cells and at least one ground selection transistor.

Memory cell array 110 stores voltage-to-time lookup table 112 and time stamp 114 as described with reference to FIG. 1. Voltage-to-time lookup table 112 may be stored in a meta area (not shown) for managing data. Herein, the meta area may be an area that stores management information for managing nonvolatile memory device 100. Time stamp 114 may also be stored in the meta area, or in memory blocks BLK1 to BLKz.

Address decoder 120 selects one of memory blocks BLK1 to BLKz in response to an address. Address decoder 120 is connected to memory cell array 110 through the word lines, the at least on string selection line SSL, and the at least one ground selection line GSL. Address decoder 120 selects the word lines, the at least one string selection line SSL, and the at least one ground selection line GSL using a decoded row address. Address decoder 120 decodes a column address of an input address. Here, the decoded column address may be transferred to input/output circuit 130. Address decoder 120 may comprise, but is not limited to, a row decoder, a column decoder, an address buffer, and so on.

Input/output circuit 130 is connected to memory cell array 110 through corresponding bit lines. Input/output circuit 130 receives the decoded column address from address decoder 120, and it selects the corresponding bit lines using the decoded column address.

Input/output circuit 130 receives data from an external device (e.g., memory controller 200 in FIG. 1) and stores the input data in memory cell array 110. Input/output circuit 130 reads data from memory cell array 110 and outputs the read data to the external device. Meanwhile, input/output circuit 130 reads data from a first area of memory cell array 110 and stores the read data in a second area of memory cell array 110. For example, input/output circuit 130 may perform a copy-back operation.

Control logic 140 controls various operations of VNAND 100, such as, e.g., program operations, read operations, and erase operations. Control logic 140 operates in response to control signals or commands that are provided from the external device.

Nonvolatile memory device 100 stores time stamp 114, in which there is registered a global time Tglobal reflecting a power-off-time in a program operation, establishes a desired read voltage using voltage-to-time lookup table 112 and time stamp 114 in a read operation, and performs the read operation using the desired read voltage thus set up.

Figure 4:
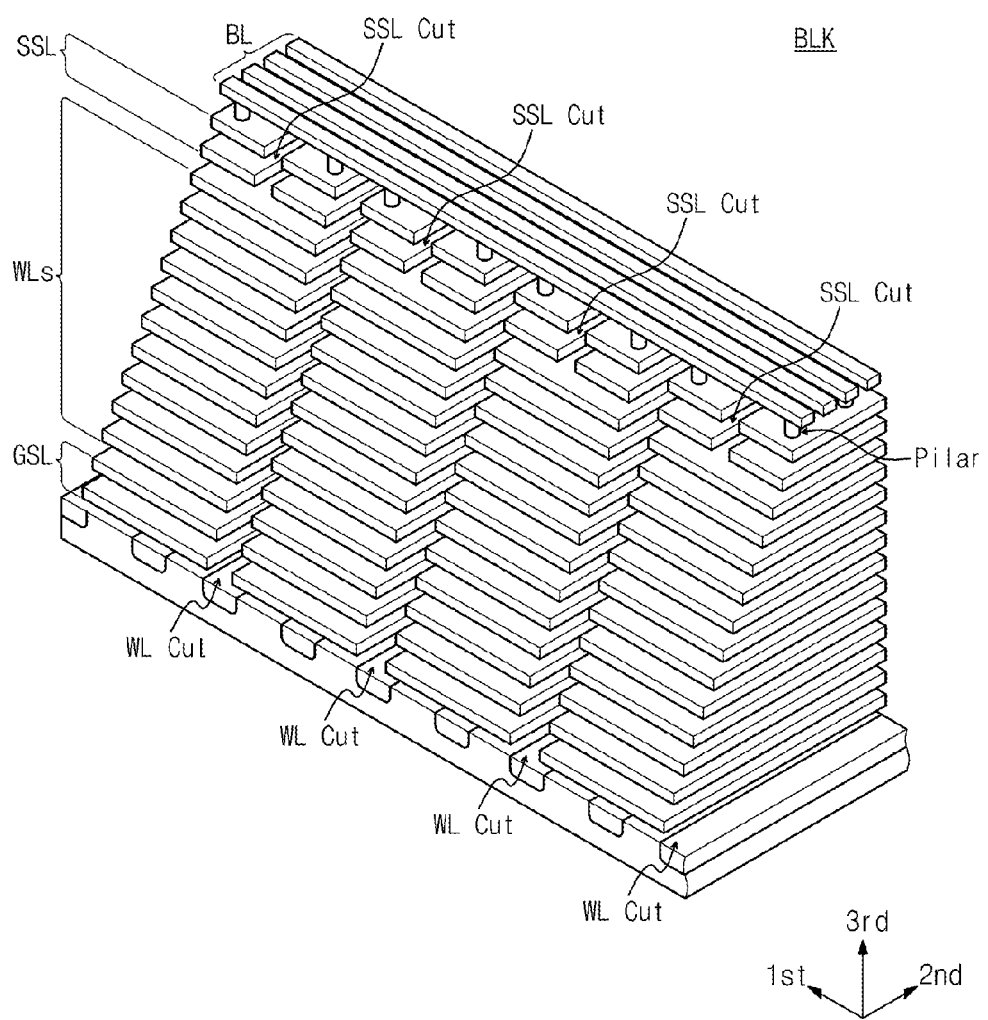
FIG. 4 is a perspective view of a memory block BLK shown in FIG. 3.

FIG. 4 is a perspective view of a memory block BLK shown in FIG. 3.

Referring to FIG. 4, four sub-blocks are formed on a substrate. Each sub-block is formed by stacking and cutting at least one ground selection line GSL, multiple word lines, and at least one string selection line SSL on the substrate in a plate shape. Here, the at least one string selection line SSL is separated by string selection line cuts.

At least one plate-shaped dummy line is formed between ground selection line GSL and the word lines. Alternatively, at least one plate-shaped dummy line may be formed between the word lines and string selection line SSL.

Although not shown in FIG. 4, each word line cut among the sub-blocks may comprise a common source line CSL. Common source lines CSL in the word line cuts are typically interconnected. A string may be formed by making a pillar connected to a bit line penetrate the at least one string selection line SSL, the word lines, and the at least one ground selection line GSL.

Although FIG. 4 illustrates a configuration in which a structure between word line cuts adjacent to each other is a sub-block, the inventive concept is not limited to this configuration. In one alternative, for example, a structure between a word line cut and a string selection line cut may be defined as a sub-block. Memory block BLK may be implemented to have a merged word line structure where two word lines are merged to one.

Figure 5:
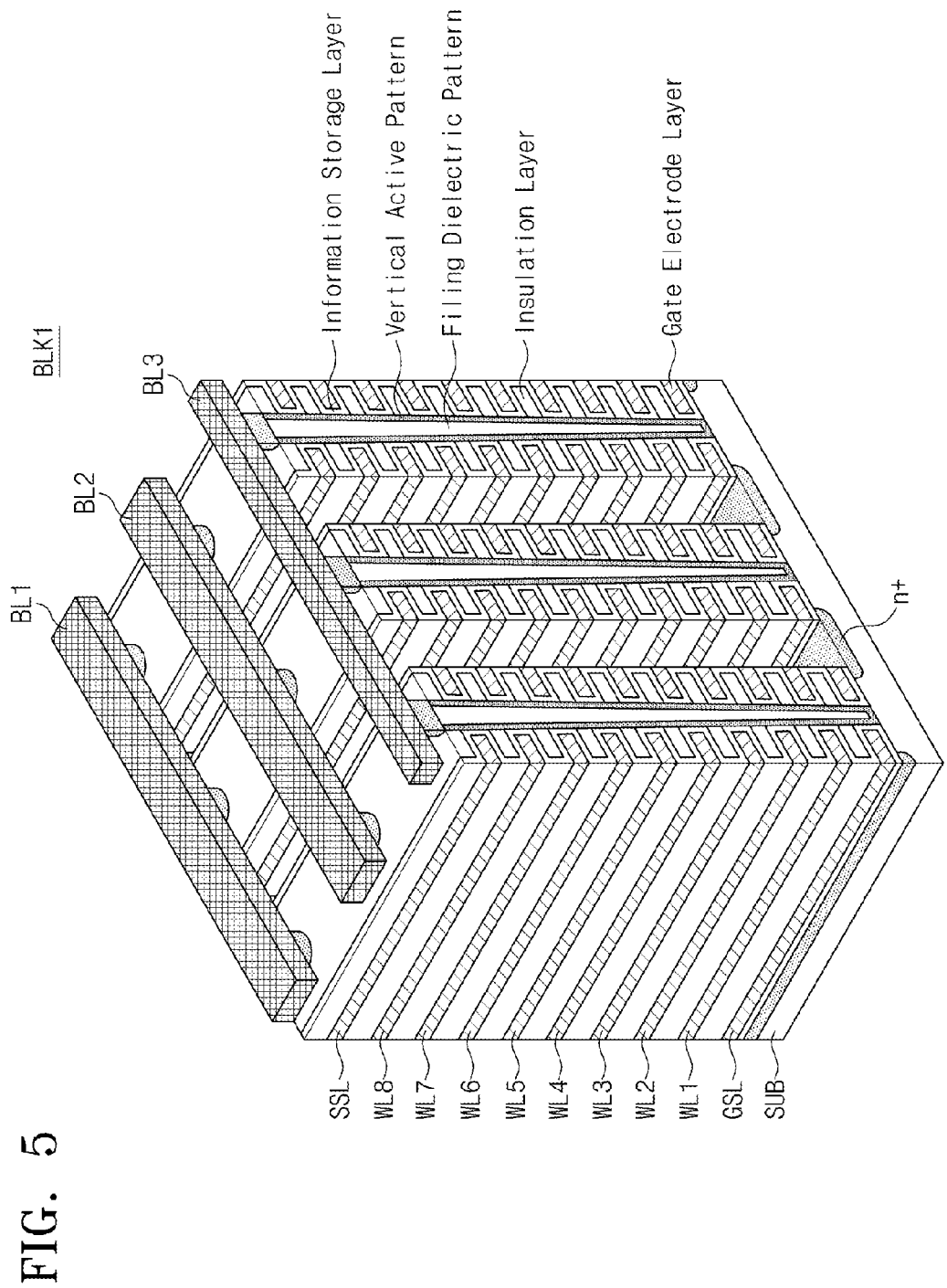
FIG. 5 is a perspective view illustrating a memory block according to an embodiment of the inventive concept.

FIG. 5 is a perspective view illustrating a memory block according to an embodiment of the inventive concept.

Referring to FIG. 5, a memory block BLK1 is disposed in a direction perpendicular to a substrate SUB, and an n+ doping region is formed in substrate SUB.

A gate electrode layer and an insulation layer are deposited on substrate SUB in turn. An information storage layer is formed between the gate electrode layer and the insulation layer. Where the gate electrode layer and the insulation layer are patterned in a vertical direction, a V-shaped pillar is formed. The pillar is connected to substrate SUB through the gate electrode layer and the insulation layer. An outer portion of the pillar may be formed of channel semiconductor as a vertical active pattern, and an inner portion thereof may be formed of an insulation material such as silicon oxide as a filing dielectric pattern.

The gate electrode layer of memory block BLK1 is connected to a ground selection line GSL, multiple word lines WL1 to WL8, and a string selection line SSL. The pillars of memory block BLK1 are connected to multiple bit lines BL1 to BL3. Although FIG. 5 illustrates an example where one memory block BLK1 has two selection lines SSL and GSL, eight word lines WL1 to WL8, and three bit lines BL1 to BL3, the inventive concept is not limited thereto.

Figure 6:
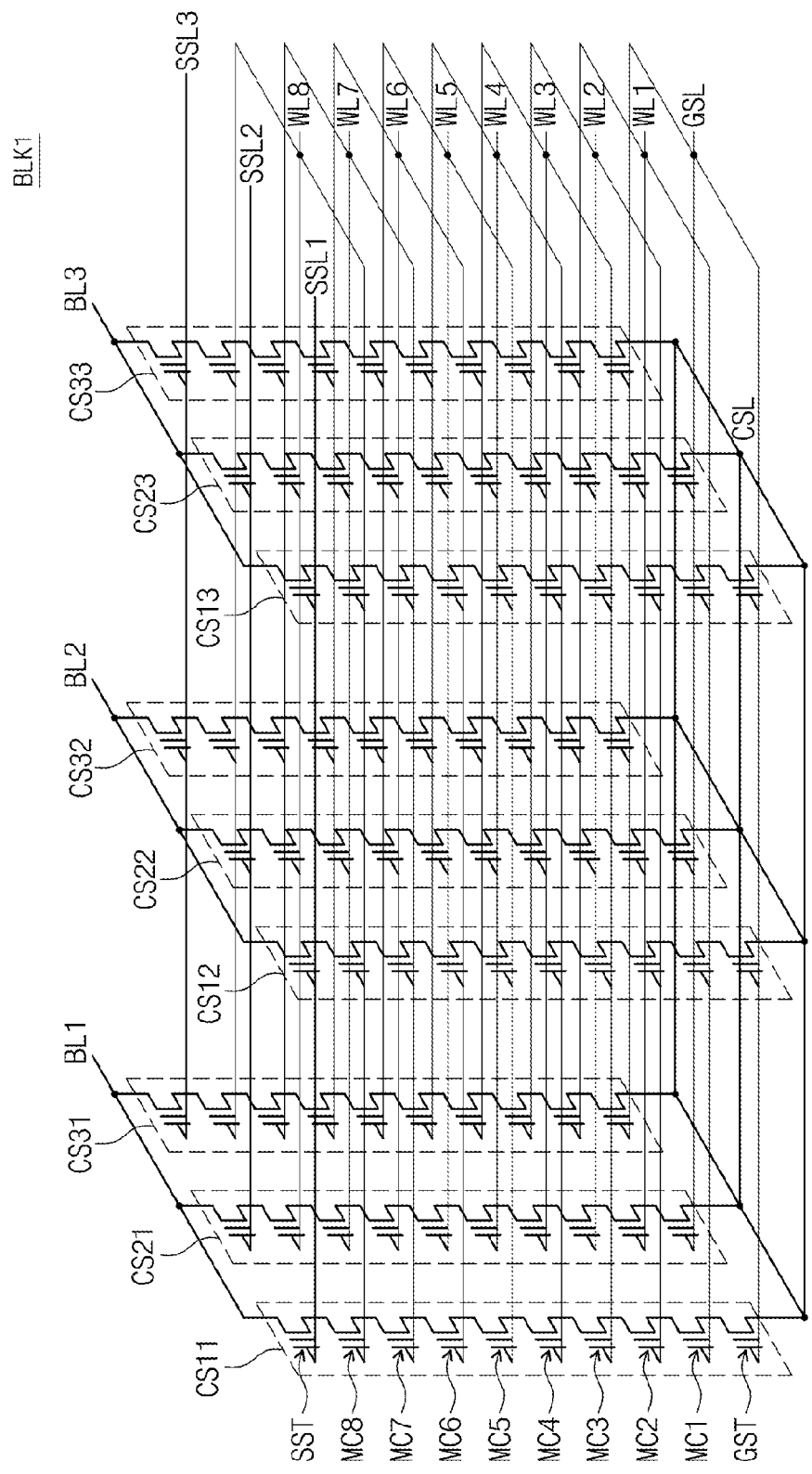
FIG. 6 is a circuit diagram illustrating an equivalent circuit of a memory block shown in FIG. 5, according to an embodiment of the inventive concept.

FIG. 6 is a circuit diagram illustrating an equivalent circuit of a memory block BLK1 shown in FIG. 5, according to an embodiment of the inventive concept.

Referring to FIG. 6, cell strings CS11 to CS33 may be connected between bit lines BL1 to BL3 and a common source line CSL. Each cell string (e.g., CS11) comprises a string selection transistor SST, multiple memory cells MC1 to MC8, and a ground selection transistor GST.

String selection transistors SST are connected to a string selection line SSL. String selection line SSL is divided into first to third string selection lines SSL1 to SSL3. Although FIG. 6 illustrates three string selection line SSL1 to SSL3 corresponding to a bit line, the inventive concept is not limited thereto. In general, memory block BLK1 may be implemented to include at least two string selection lines corresponding to a bit line.

In each string, memory cells MC1 to MC8 are connected to corresponding word lines WL1 to WL8. A set of memory cells that are connected to a word line and programmed at the same time may be referred to as a page. Memory block BLK1 is formed of multiple pages. Also, a word line is connected with multiple pages. Referring to FIG. 6, a word line (e.g., WL4) with the same height from common source line CSL is connected in common to three pages.

Meanwhile, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In a 2-bit MLC, two pages of data may be stored at a physical page. Thus, six pages of data may be stored at memory cells connected to a word line WL4.

A nonvolatile memory device may be implemented with a CTF memory cells. In this case, there may be generated such an initial verify shift (IVS) phenomenon that charges trapped in programmed CTF are redistributed and leaked by lapse of time. Reprogramming may be performed to overcome such distribution deterioration.

Figure 7:
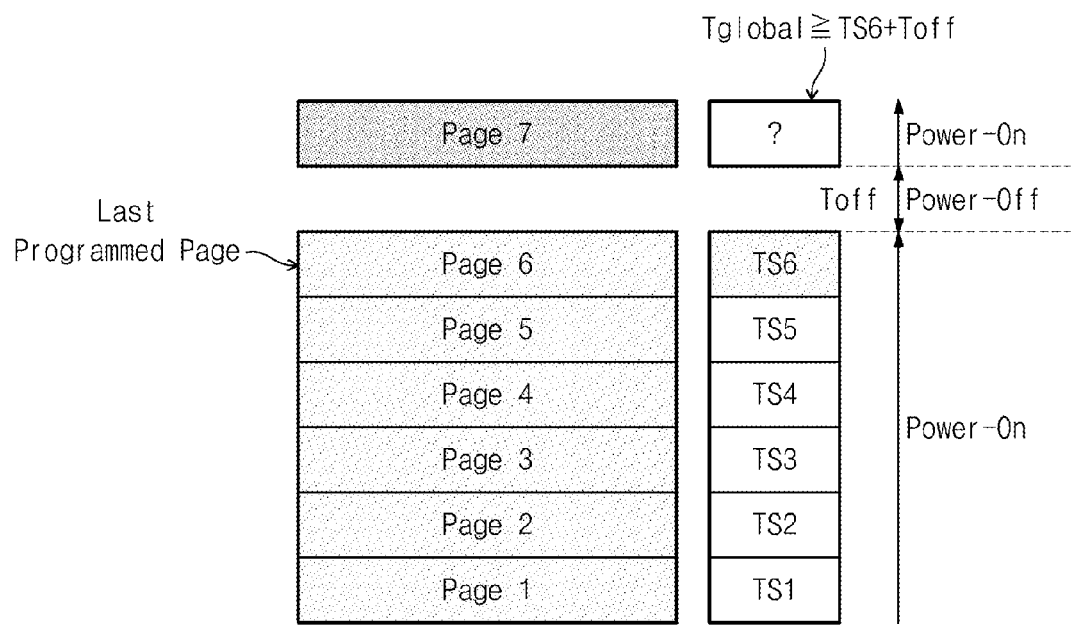
FIG. 7 is a diagram illustrating a time stamp storing method according to an embodiment of the inventive concept.

FIG. 7 is a diagram illustrating a time stamp storing method according to an embodiment of the inventive concept.

Referring to FIG. 7, a time stamp may be stored per page. For ease of description, FIG. 7 shows an example where a program operation on a sixth page is ended and then a power is turned off. A current time of timer 220 may be stored as a time stamp TS6 in a program operation on the sixth page. Time stamp TS6 associated with the sixth page may be stored in a space area of the sixth page or in another memory block that does not include the sixth page.

Timer 220 is reset where storage device 10 is powered off. Where power is turned on after an off-time Toff, that is, a time when power is turned off, timer 220 is again activated to generate a current time. A current time thus generated is a global time Tglobal. Herein, as an initial time, global time Tglobal may be set to a sum of time stamp TS6 corresponding to the sixth page and off-time Toff. Off-time Toff is calculated as described with reference to FIG. 2. A newly set global time Tglobal may be stored as a time stamp in a program operation on a seventh page.

Although FIG. 7 illustrates an example in which a time stamp is stored per page, the inventive concept is not limited thereto. Alternatively, for instance, a time stamp may be stored based on a zone that is formed of continuous pages.

Figure 8:
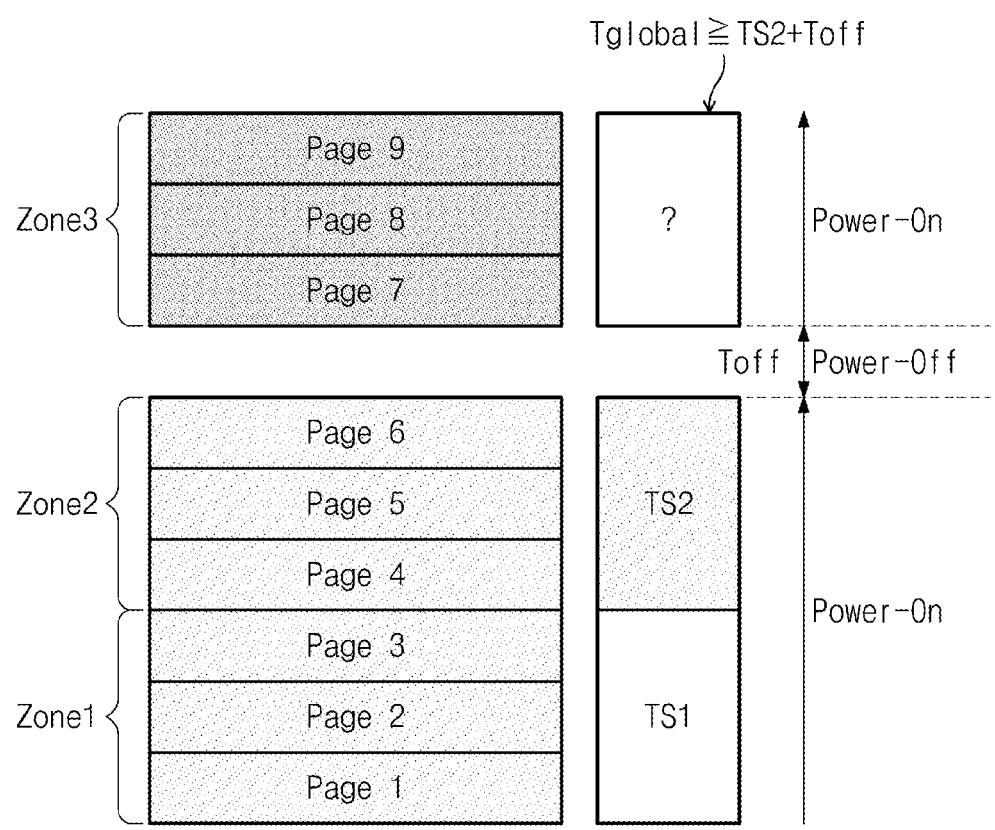
FIG. 8 is a diagram illustrating a time stamp storing method according to another embodiment of the inventive concept.

FIG. 8 is a diagram illustrating a time stamp storing method according to another embodiment of the inventive concept.

Referring to FIG. 8, a time stamp may be stored by zone. For convenience, FIG. 8 shows an example where a zone is formed of three pages. However, the inventive concept is not limited thereto. Zones of the inventive concept may be configured to include the same or different number of pages. In each zone, pages may be continuous. Also, pages of the inventive concept may be physical or logical pages.

It is assumed that a program operation on a second zone is performed and then power is turned off. In this case, a global time Tglobal of a timer 220 may be stored as a time stamp in a program operation on at least one of pages Page 7 to Page 9 of a third zone. Herein, as an initial time, global time Tglobal may be set to a sum of a time stamp TS2 corresponding to the second zone and off-time Toff.

Also, as described with reference to FIG. 2, off-time Toff may be determined based on voltage-to-time lookup table 112 and desired read voltage Vr_desired. Herein, voltage-to-time lookup tables 112 of zones may be different from one another.

Although FIG. 8 illustrates an example in which a time stamp is stored by the zone, the inventive concept is not limited thereto. For example, the time stamp may be stored by the memory block.

Figure 9:
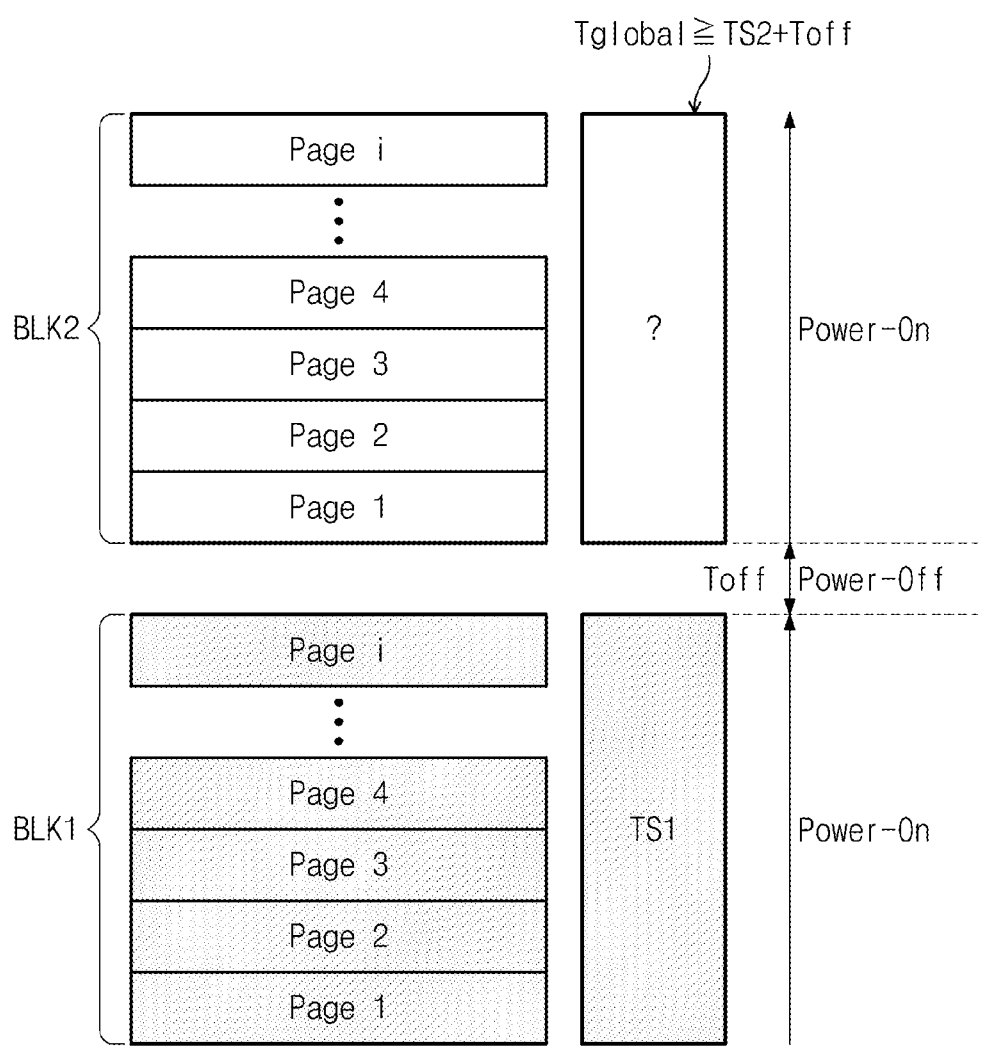
FIG. 9 is a diagram illustrating a time stamp storing method according to still another embodiment of the inventive concept.

FIG. 9 is a diagram illustrating a time stamp storing method according to still another embodiment of the inventive concept.

Referring to FIG. 9, a time stamp is stored by the memory block. In FIG. 9, it is assumed that a first time stamp TS1 is stored in a predetermined area in a program operation on at least one page of a first memory block BLK1. Following power off, a global time Tglobal is stored as a time stamp in a program operation on any one of a second memory block BLK2 if a storage device 10 is powered on. Herein, as an initial time, global time Tglobal may be set to a sum of first time stamp TS1 corresponding to the first memory block and off-time Toff.

According to the above description, storage device 10 stores as a time stamp a global time Tglobal considering an off-time Toff corresponding to a power-off interval.

Figure 10:
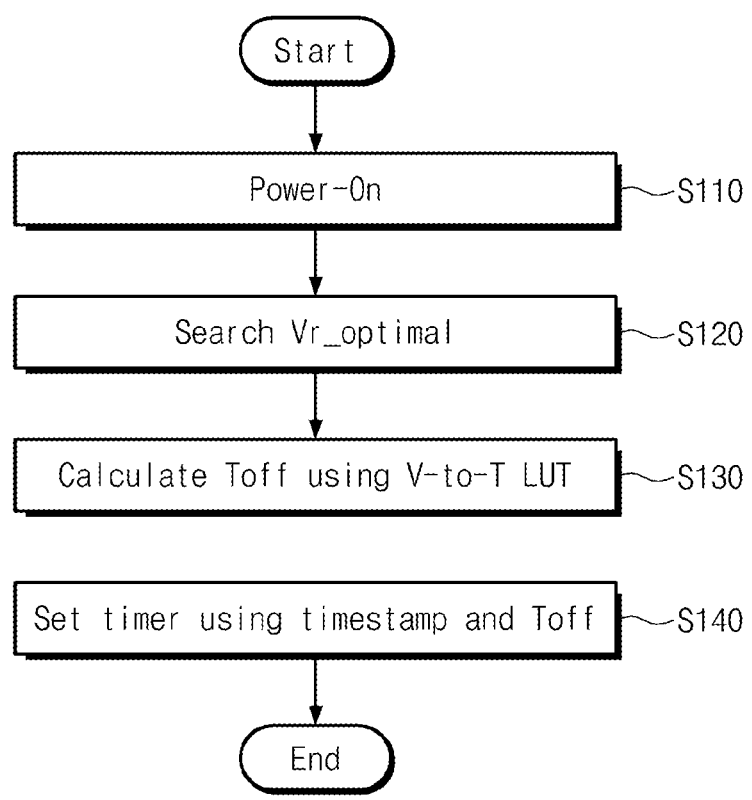
FIG. 10 is a flowchart illustrating a method of setting a timer of a storage device 10 according to an embodiment of the inventive concept.

FIG. 10 is a flowchart illustrating a method of setting timer 220 of storage device 10 according to an embodiment of the inventive concept. The method of FIG. 10 will be described with reference to FIGS. 1 to 10.

Referring to FIGS. 1 to 10, storage device 10 may be powered on at a power-off mode or a sleep mode. Timer 220 detects a power-on state and is activated according to a result of the detection. Alternatively, timer 220 may be activated by an external request (e.g., a host request). At this time, information (e.g., a clock) associated with a current time is received from an external device (S110).

Memory controller 100 of storage device 10 searches for desired read voltage Vr_desired to calculate an off-time Toff corresponding to a power-off interval. Herein, desired read voltage Vr_desired may be a read voltage on at least one memory cell that is connected to at least one page. For example, desired read voltage Vr_desired may be determined by performing a scan read operation on a page that is lastly programmed before power-off. However, the inventive concept is not limited thereto. For example, desired read voltage Vr_desired may be determined from scan read operations on multiple pages that have been programmed before power-off (S120).

In step S130, if desired read voltage Vr_desired is searched for, an off-time Toff is calculated using voltage-to-time lookup table 112. At this time, timer 220 determines global time Tglobal using a time stamp corresponding to a most recently programmed page, and off-time Toff. Where storage device 10 is powered on, in step S140, memory controller 200 of storage device 10 reads a time stamp stored in nonvolatile memory device 100.

The above-described timing setting method calculates off-time Toff using voltage-to-time lookup table 112 and reflects off-time Toff calculated to global time Tglobal.

Figure 11:
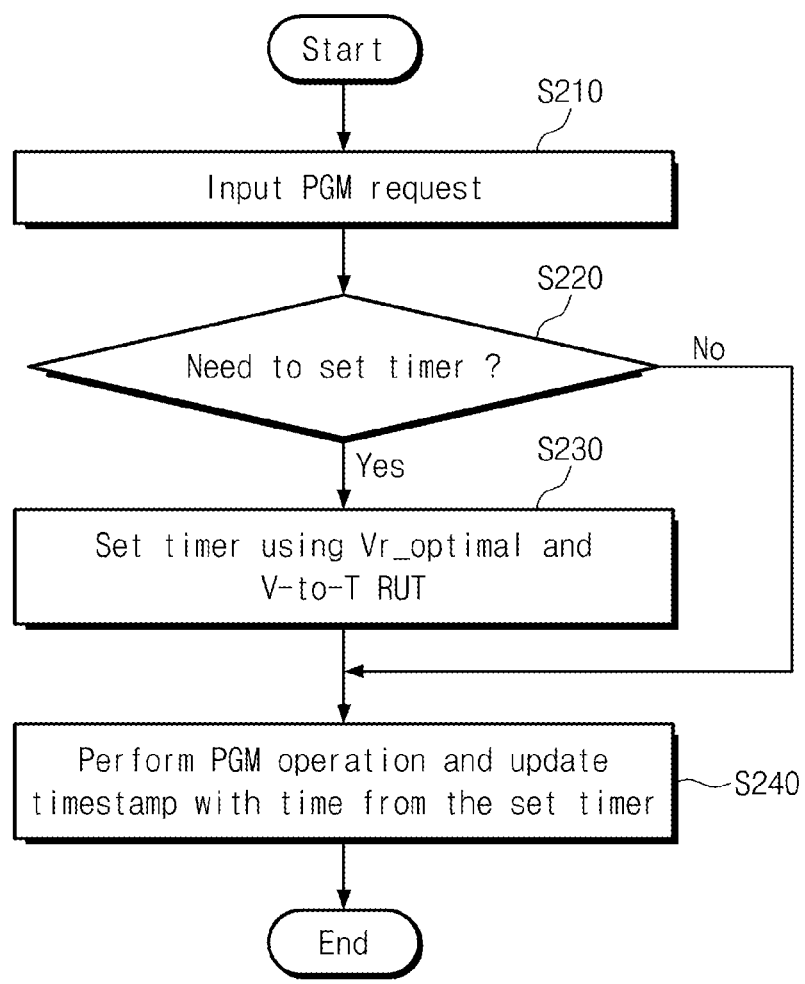
FIG. 11 is a flowchart illustrating a program method of a storage device according to an embodiment of the inventive concept.

FIG. 11 is a flowchart illustrating a method of programming a storage device according to an embodiment of the inventive concept. The method of FIG. 11 will be described with reference to FIGS. 1 to 11.

Referring to FIG. 11, in step S210, a program request is received from an external device. In step S220, memory controller 200 of storage device 10 determines whether to set timer 220. The determination of whether to set timer 220 may be performed according to information stored in the input program request or a user's request. In other embodiments, whether to set timer 220 may be determined based on hardware/software/firmware conditions.

As a consequence of determining that setting of timer 220 is required, in step S230, timer 220 is set to generate a global time Tglobal using a desired read voltage Vr_desired and voltage-to-time lookup table 112. Here, timer 220 may be set in the same manner as described with reference to FIG. 10.

In contrast, as a consequence of determining that setting of timer 220 is not required, in step S240, a time stamp is updated with global time Tglobal generated from the set timer 220 and a program operation corresponding to the program request is performed.

The program operation according to an embodiment of the inventive concept is performed while updating global time Tglobal with a time stamp. Meanwhile, a program operation according to an embodiment of the inventive concept stores a time stamp at a page at the same time with a program operation on the page.

Figure 12:
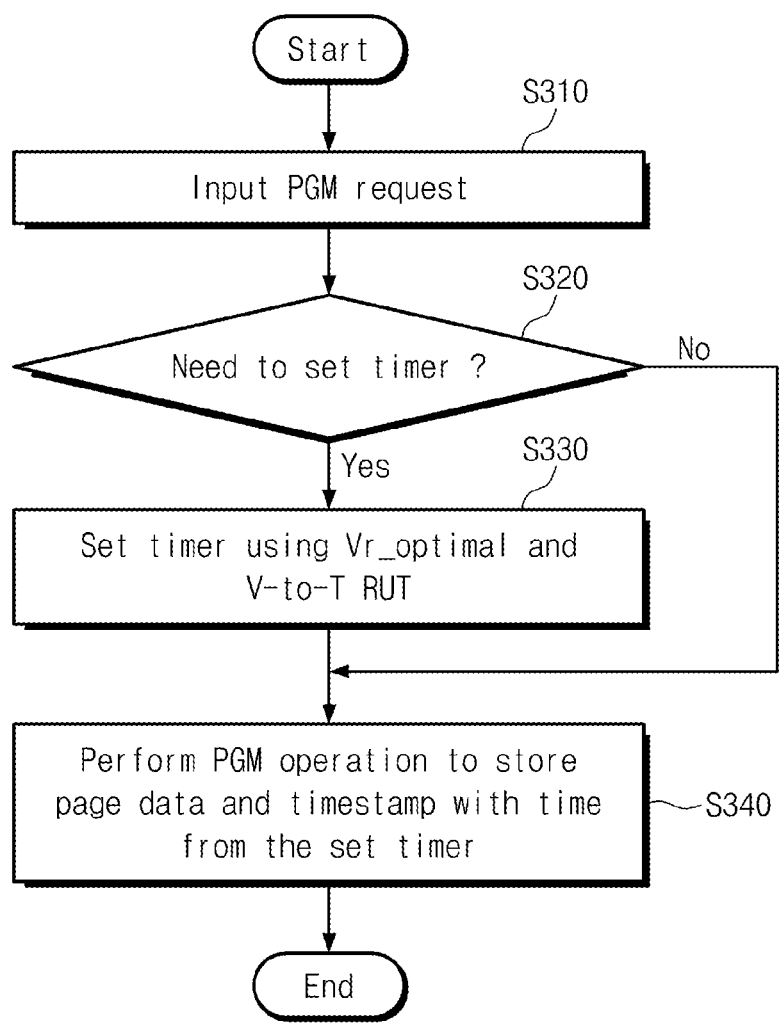
FIG. 12 is a flowchart illustrating a program method of a storage device, according to another embodiment of the inventive concept.

FIG. 12 is a flowchart illustrating a program method of a storage device 10, according to another embodiment of the inventive concept. Now will be described a program method of a storage device 10 with reference to FIGS. 1 to 10 and 12.

Referring to FIG. 12, in step S310, a program request is received from an external device. In step S320, memory controller 200 of storage device 10 determines whether to set timer 220. As a consequence of determining that the setting of timer 220 is required, in step S330, timer 220 is set to generate a global time Tglobal using a desired read voltage Vr_desired and voltage-to-time lookup table 112. Here, timer 220 may be set in the same manner as described with reference to FIG. 10. In contrast, as a consequence of determining that setting of timer 220 is not required, the method proceeds to step S340, in which there is performed a program operation in which program data corresponding to the program request and a time stamp with a global time Tglobal generated from the set timer 220 are programmed at a page at the same time. At this time, a time stamp is stored in a predetermined (e.g., spare) area.

A program method according to an embodiment of the inventive concept may store a time stamp with a global time Tglobal and page data at in a page at the same time.

Methods described with reference to FIGS. 11 and 12 comprise determining whether to set a time. However, the inventive concept is not limited thereto. A program method according to an embodiment of the inventive concept may stores a current time (e.g., a global time Tglobal), which a timer generates in real time in response to a program request, while performing a program operation.

Figure 13:
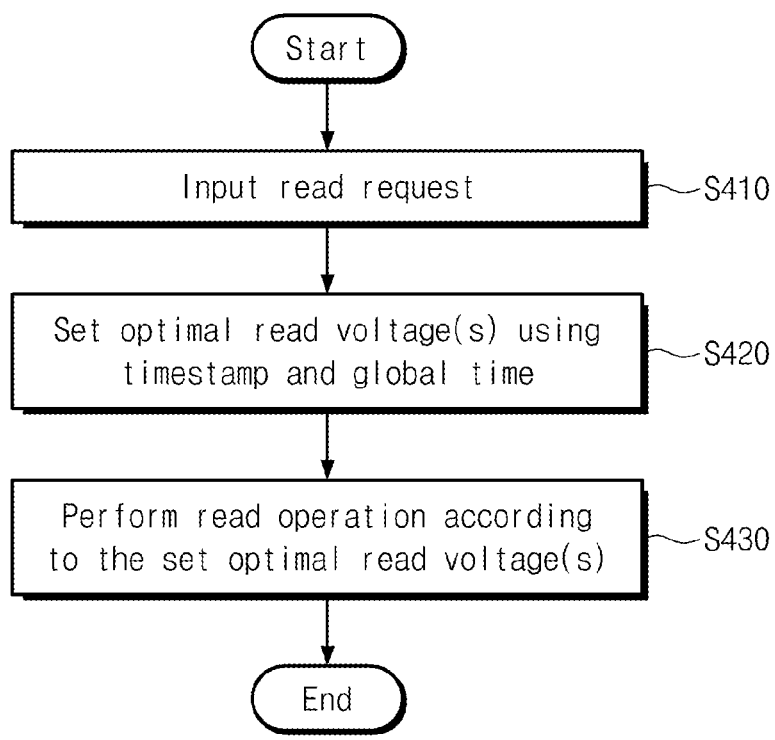
FIG. 13 is a flowchart illustrating a read method of a storage device according to an embodiment of the inventive concept.

FIG. 13 is a flowchart illustrating a read method of a storage device according to an embodiment of the inventive concept. The method of FIG. 13 will be described with reference to FIGS. 1 to 13.

Referring to FIGS. 1 to 13, storage device 10 receives a read request. A time that a page to be read experiences after a program operation is calculated using a time stamp, read from at least one nonvolatile memory device 100, and global time Tglobal. Herein, a time registered at the time stamp may be a global time Tglobal described with reference to FIGS. 1 to 12. Thus, a time that a page to be read experiences may be a current time of a timer 220 minus a time registered at a time stamp. A desired read voltage(s) Vr_desired for a page read operation may be determined based on a time that a page experiences. As a result, at least one read voltage is determined using the time stamp (S420). In step S430, a read operation is carried out using the desired read voltage(s) Vr_desired.

A read method of a storage device according to an embodiment of the inventive concept determines the desired read voltage(s) Vr_desired using a time stamp comprising a global time Tglobal and performs the desired read voltage(s) Vr_desired thus determined.

In FIG. 1, voltage-to-time lookup table 112 is illustrated as being in nonvolatile memory device 100. However, the inventive concept is not limited thereto. Voltage-to-time lookup table 112 may be placed outside of a memory controller.

Figure 14:
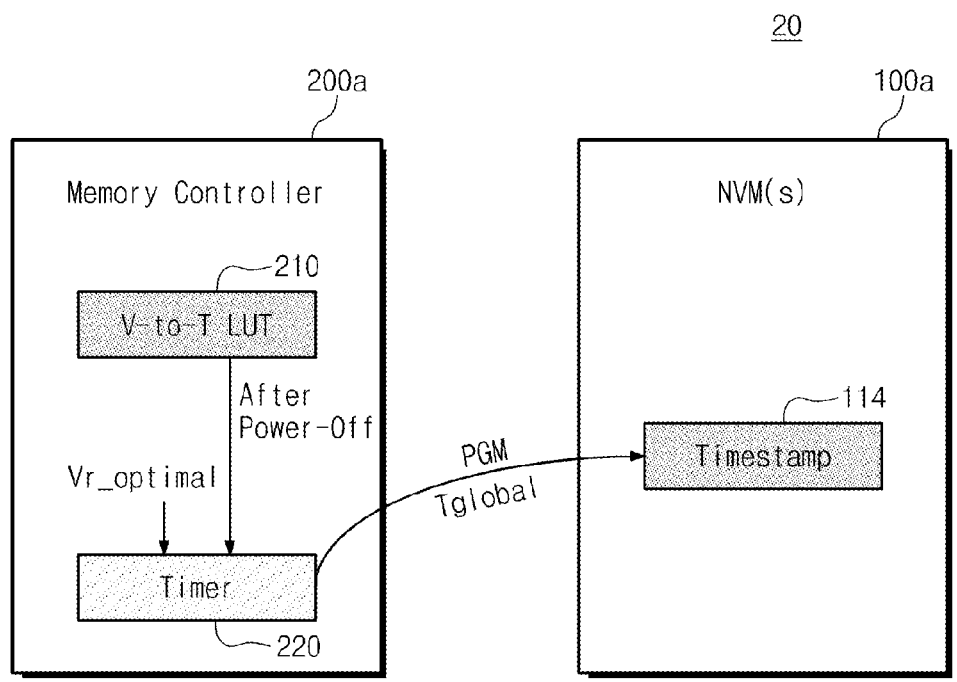
FIG. 14 is a block diagram illustrating a storage device according to another embodiment of the inventive concept.

FIG. 14 is a block diagram illustrating a storage device 20 according to another embodiment of the inventive concept.

Referring to FIG. 14, a storage device 20 comprises at least one nonvolatile memory device 100a and a memory controller 200a controlling the same. Nonvolatile memory device 100a is different from that shown in FIG. 1 in that voltage-to-time lookup table is removed. Memory controller 200a incorporates voltage-to-time lookup table 210 and timer 220. In embodiments, the voltage-to-time lookup table 210 may be stored in a nonvolatile memory device that is placed in memory controller 200a. Timer 220 outputs a global time Tglobal after power-off.

Meanwhile, in FIGS. 1 to 14, a desired read voltage Vr_desired may be searched to calculate an off-time Toff. However, the inventive concept is not limited thereto. In some embodiments, a storage device comprises a flag cell for calculating an off-time Toff and calculates off-time Toff corresponding to a power-off interval according to a variation in a threshold voltage of the flag cell.

Figure 15:
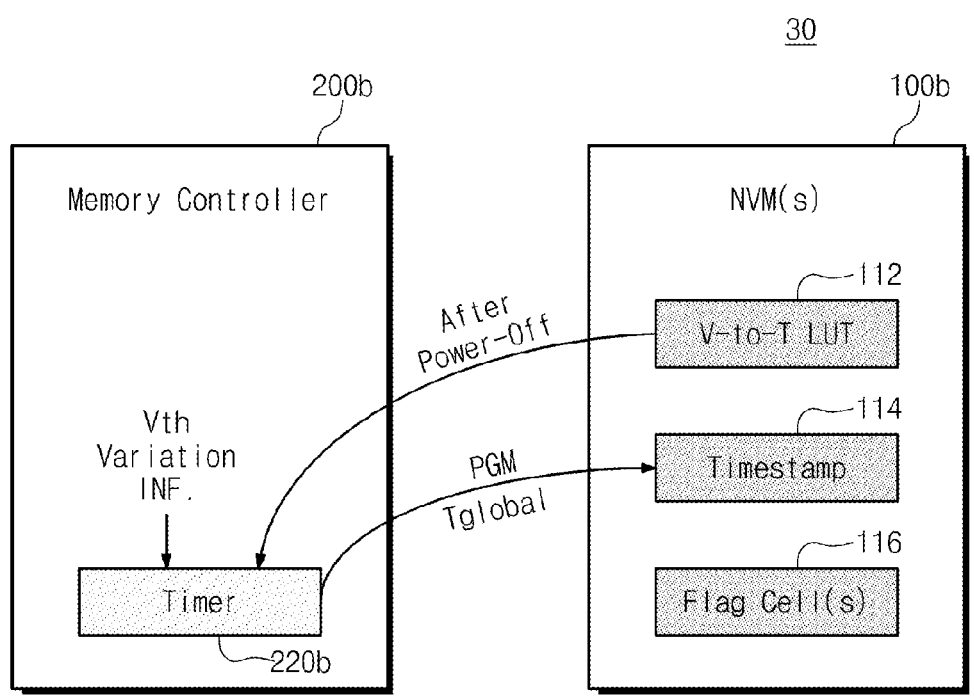
FIG. 15 is a block diagram illustrating a storage device according to still another embodiment of the inventive concept.

FIG. 15 is a block diagram illustrating a storage device 30 according to still another embodiment of the inventive concept.

Referring to FIG. 15, a storage device 30 comprises at least one nonvolatile memory device 100a and a memory controller 200b controlling the same. As compared with nonvolatile memory device 100 shown in FIG. 1, nonvolatile memory device 100b further comprises at least one flag cell 116. Here, a threshold voltage of flag cell 116 is varied by lapse of time, which is used to predict a power-off-time. Memory controller 200a comprises a timer 220b that generates a global time Tglobal using information associated with a variation in a threshold voltage of flag cell 116 and voltage-to-time lookup table 112. A time stamp 114 stored may be a global time Tglobal of timer 220b.

Storage device 300 according to an embodiment of the inventive concept has at least one flag cell 116 to calculating a power-off-time and generates a global time Tglobal using a time corresponding to a variation in a threshold voltage of flag cell 116.

A timer described with reference to FIGS. 1 to 15 calculates an off-time Toff corresponding to a power-off interval using a time associated with a voltage variation. However, the inventive concept is not limited thereto. For example, the timer may calculate an off-time Toff corresponding to a power-off interval using various methods. For example, information on a current time is received from the outside of a storage device, and an off-time Toff is calculated using the input information on the current time and a time registered at a time stamp.

Meanwhile, a timer according to an embodiment of the inventive concept may generate a global time Tglobal based on information on a current time transferred from a host, without calculating an off-time Toff.

Figure 16:
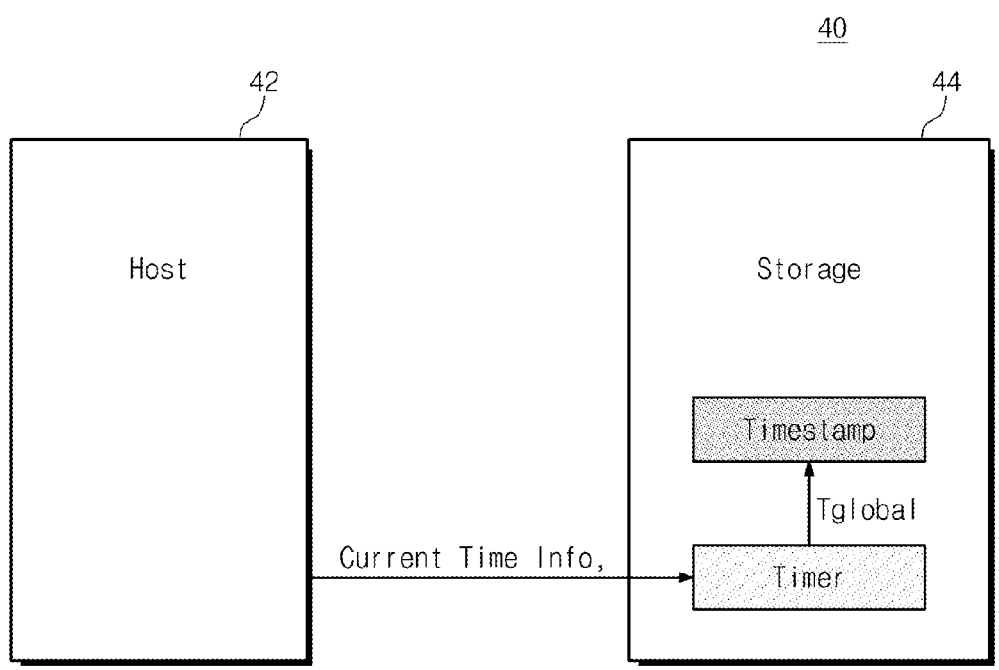
FIG. 16 is a block diagram illustrating a host system according to an embodiment of the inventive concept.

FIG. 16 is a block diagram illustrating a host system 40 according to an embodiment of the inventive concept.

Referring to FIG. 16, host system 40 comprises a host 42 and a storage device 44. Host 42 provides current time information to storage device 44. Storage device 44 comprises a timer that generates a global time Tglobal using the current time information input from host 42 and stores global time Tglobal as a time stamp in a program operation. Here, the current time information is output from host 42 according to a request of storage device 100. Alternatively, the current time information may be provided from host 42 to set a timer based on power-off information on storage device 44.

Figure 17:
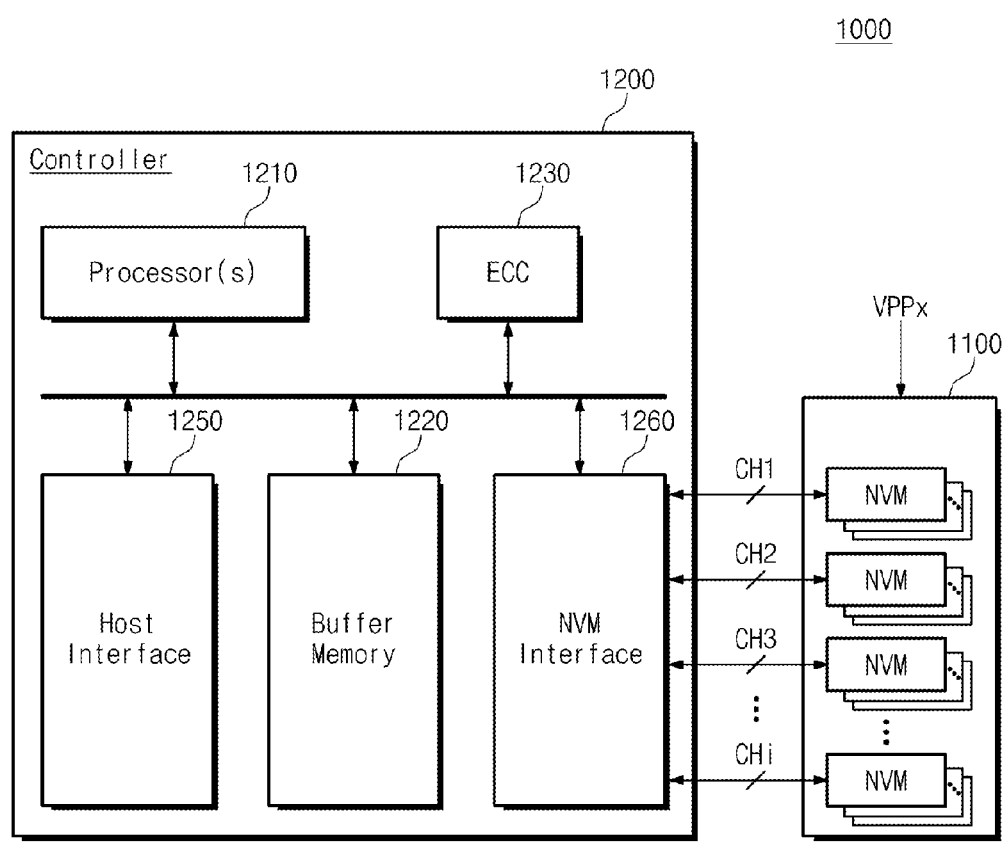
FIG. 17 is a block diagram illustrating a solid state drive according to an embodiment of the inventive concept.

FIG. 17 is a block diagram illustrating a solid state drive (SSD) 1000 according to an embodiment of the inventive concept.

Referring to FIG. 17, SSD 1000 comprises multiple nonvolatile memory devices 1100 and an SSD controller 1200. Nonvolatile memory devices 1100 are implemented to be provided with an external high voltage VPPx optionally. Each of nonvolatile memory devices 1100 is implemented to store global time Tglobal as a time stamp as described with reference to FIGS. 1 to 15.

SSD controller 1200 is connected to nonvolatile memory devices 1100 through multiple channels CH1 to CHi (i>1). SSD controller 1200 comprises one or more processors 1210, a buffer memory 1220, an ECC block 1230, a host interface 1250, and a nonvolatile memory interface 1260.

Buffer memory 1220 stores data needed to drive SSD controller 1200. Buffer memory 1220 typically comprises multiple memory lines each of which stores data or a command. Here, the memory lines may be mapped onto cache lines according to a variety of methods. ECC block 1230 calculates error correction code values of data to be programmed at a write operation and corrects an error of read data using an error correction code value in a read operation.

In a data recovery operation, ECC block 1230 may correct an error of data recovered from nonvolatile memory devices 1100. Although not shown in FIG. 17, a code memory may be further included to store code data needed to drive SSD controller 1200. The code memory may be implemented with a nonvolatile memory device.

Host interface 1250 provides an interface with an external device. Host interface 1250 may be a NAND flash interface. Host interface 1250 may be implemented with various interfaces or multiple interfaces. Nonvolatile memory interface 1260 provides an interface with nonvolatile memory device 1100.

SSD 1000 stores a time stamp using global time Tglobal, and it performs a read operation according to a desired read level using the time stamp, thereby improving reliability of data. The inventive concept is applicable to an eMMC (e.g., an embedded multimedia card, moviNAND, iNAND, etc.).

Figure 18:
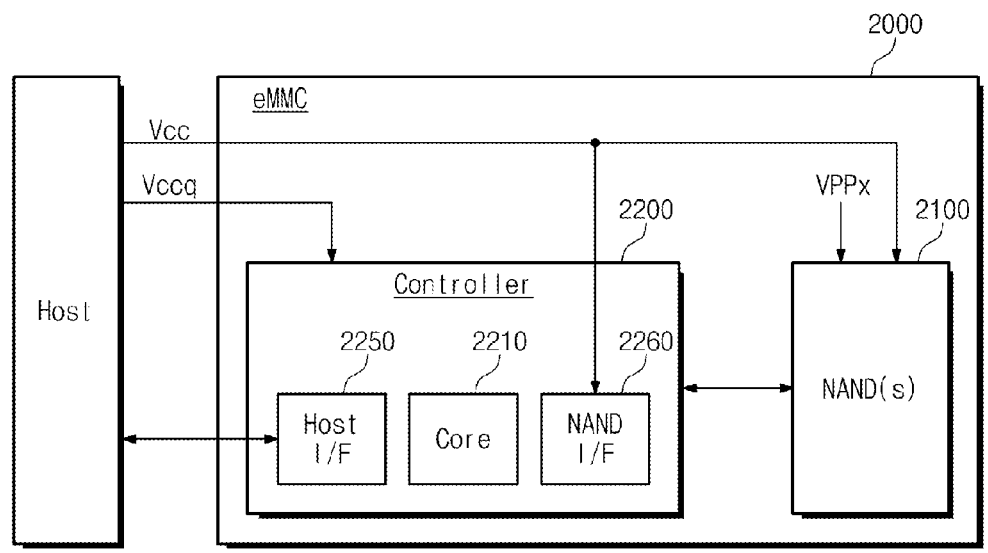
FIG. 18 is a block diagram illustrating an eMMC according to an embodiment of the inventive concept.

FIG. 18 is a block diagram illustrating an eMMC according to an embodiment of the inventive concept.

Referring to FIG. 18, an eMMC 2000 comprises one or more NAND flash memory devices 2100 and a controller 2200. eMMC 2000 is implemented with one of storage devices 10, 20, and 30 shown in FIGS. 1, 14, and 15. NAND flash memory device 2100 is a single data rate (SDR) NAND flash memory device or a double data rate (DDR) NAND flash memory device. Or, NAND flash memory device 2100 is a vertical NAND flash memory device (VNAND) and sets a desired read voltage according to a global time Tglobal. Controller 2200 is connected to NAND flash memory device 2100 via multiple channels. Controller 2200 comprises one or more controller cores 2210, a host interface 2250, and a NAND interface 2260. Controller core 2210 may control an overall operation of eMMC 2000. Host interface 2250 is configured to perform an interface between controller 2210 and a host. NAND interface 2260 is configured to provide an interface between NAND flash memory device 2100 and controller 2200. In example embodiments, host interface 2250 may be a parallel interface (e.g., MMC interface). In other embodiments, host interface 2250 of eMMC 2000 may be a serial interface (e.g., UHS-II, USF interface).

eMMC 2000 receives power supply voltages Vcc and Vccq from the host. Herein, power supply voltage Vcc (e.g., about 3.3 V) may be supplied to NAND flash memory device 2100 and NAND interface 2260, and power supply voltage Vccq (e.g., about 1.8 V/3.3 V) may be supplied to controller 2200. eMMC 2000 may be optionally supplied with an external high voltage.

eMMC 2000 uses a global time Tglobal using a power-off-time as a time stamp to improve reliability of data.

Figure 19:
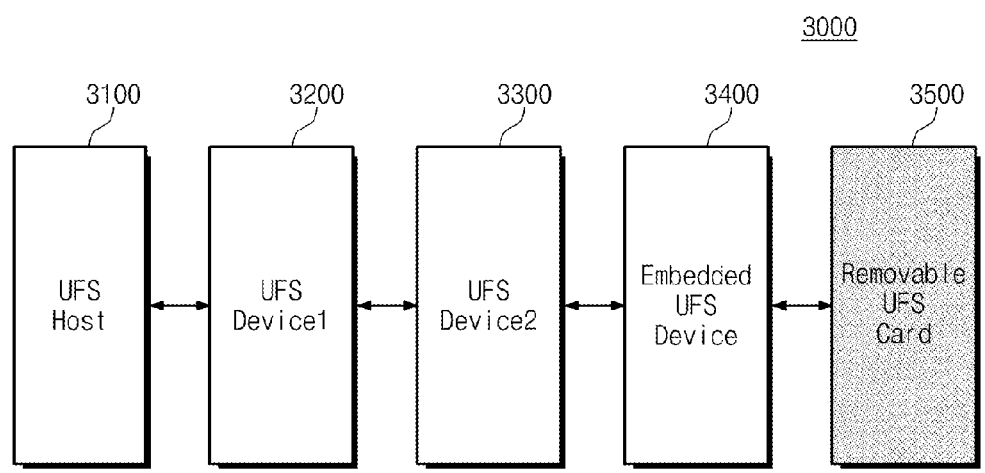
FIG. 19 is a block diagram illustrating a UFS system according to an embodiment of the inventive concept.

FIG. 19 is a block diagram illustrating a UFS system 3000 according to an embodiment of the inventive concept.

Referring to FIG. 19, UFS system 3000 comprises a UFS host 3100, UFS devices 3200 and 3300, an embedded UFS device 3400, and a removable UFS card 3500. UFS host 3100 may be an application processor of a mobile device. Each of UFS host 3100, UFS devices 3200 and 3300, embedded UFS device 3400, and the removable UFS card 3500 may communicate with external devices through the UFS protocol. At least one of UFS devices 3200 and 3300, embedded UFS device 3400, and removable UFS card 3500 may be implemented with one of storage devices 10, 20, and 30 shown in FIG. 1, 14, or 15.

Meanwhile, embedded UFS device 3400 and removable UFS card 3500 may perform communications using protocols different from the UFS protocol. UFS host 3100 and removable UFS card 3500 may communicate through various card protocols (e.g., UFDs, MMC, SD (secure digital), mini SD, Micro SD, etc.).

Figure 20:
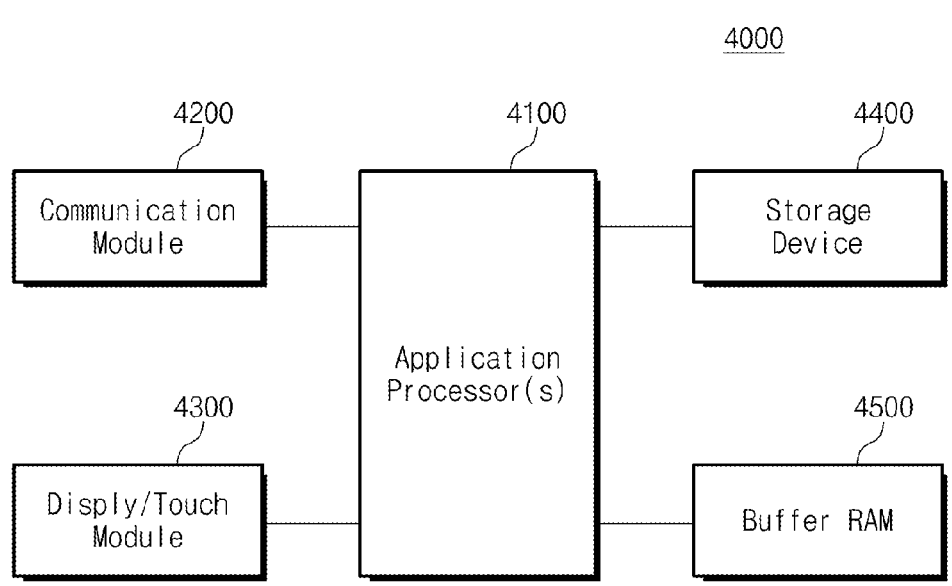
FIG. 20 is a block diagram illustrating a mobile device according to an embodiment of the inventive concept.

FIG. 20 is a block diagram illustrating a mobile device 4000 according to an embodiment of the inventive concept.

Referring to FIG. 20, mobile device 4000 comprises an application processor 4100, a communication module 4200, a display/touch module 4300, a storage device 4400, and a mobile RAM 4500.

Application processor 4100 controls an overall operation of mobile device 4000. Communication module 4200 is implemented to perform wireless or wire communications with an external device. Display/touch module 4300 is implemented to display data processed by application processor 4100 or to receive data through a touch panel. Storage device 4400 is implemented to store user data. Storage device 4400 may be, but not limited to, a memory card, an eMMC, an SSD, or an UFS device. Storage device 4400 may be implemented with a nonvolatile memory device that, as described with reference to FIGS. 1 to 15, calculates an off-time Toff corresponding to a power-off-time and reflects the calculated off-time Toff to a time stamp. Mobile RAM 4500 is configured to temporarily store data needed for a processing operation of mobile device 4000. Mobile device 4000 comprises storage device 4000 capable of improving reliability of data, so performance of system is enhanced.

A memory system and/or a storage device as described above may be packaged according to any of a variety of different packaging technologies. Examples of such packaging technologies may comprise PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A method of operating a storage device comprising at least one nonvolatile memory device and a memory controller configured to control the at least one nonvolatile memory device, the method comprising:

searching for a read voltage for at least one memory cell in at least one page when power is turned on following a power-off state;

calculating an off-time corresponding to the searched read voltage using a voltage-to-time lookup table; and setting a timer of the storage device using a time stamp corresponding to a page programmed before the power-off, and the off-time.

2. The method of claim 1, wherein the at least one nonvolatile memory device comprises multiple memory blocks each comprising multiple strings, each of the strings comprising at least one string selection transistor, multiple memory cells, and at least one ground selection transistor that are disposed between a bit line and a common source line and in a direction perpendicular to a substrate.

3. The method of claim 1, wherein searching for the read voltage comprises:
performing a scan read operation on the at least one memory cell; and
determining a voltage causing the least number of errors at the scan read operation as the read voltage.

4. The method of claim 1, wherein the at least one page comprises a most recently programmed page.

5. The method of claim 4, wherein the at least one page comprises at least one page adjacent to the most recently programmed page.

6. The method of claim 1, further comprising:
reading the voltage-to-time lookup table from the at least one nonvolatile memory device; and
reading the time stamp from the at least one nonvolatile memory device.

7. The method of claim 1, wherein the timer is reset during the power-off state and generates a global time by counting a clock at the power-on, and wherein an initial time of the global time is determined by a sum of a time registered at the time stamp and the off-time.

8. A storage device, comprising:
at least one nonvolatile memory device comprising multiple memory blocks each comprising multiple strings disposed in a direction perpendicular to a substrate and connected to a bit line, each string comprising at least one string selection transistor, multiple memory cells, and at least one ground selection transistor, wherein the at least one nonvolatile memory device stores a time stamp registering a global time in a program operation and uses the time stamp to set a desired read voltage in a read operation, and
a memory controller configured to control the at least one nonvolatile memory device and comprising a timer used to generate the global time,
wherein the timer generates the global time using a time stamp corresponding to a page programmed before a power-off state and an off-time corresponding to a variation in a read voltage until a power is turned on after the power-off state, and
wherein a relationship between the variation in the read voltage and the off-time is stored in a voltage-to-time lookup table.

9. The storage device of claim 8, wherein the voltage-to-time lookup table is stored in the at least one nonvolatile memory device.

10. The storage device of claim 8, wherein the voltage-to-time lookup table is stored in the memory controller.

11. The storage device of claim 8, wherein the time stamp is stored on a page-by-page basis.

12. The storage device of claim 11, wherein the voltage-to-time lookup table stores information on a page-by-page basis.

13. The storage device of claim 8, wherein the time stamp is stored by zone, the zone comprising a page or at least two continuous pages.

14. The storage device of claim 8, wherein the time stamp is stored by memory block.

15. The storage device of claim 8, wherein when powered on after a power-off state, the memory controller establishes a read voltage using a scan read operation on a most recently programmed page or at least one page adjacent to the most recently programmed page and calculates the off-time corresponding to the read voltage using the voltage-to-time lookup table.

16. A method of programming a storage device comprising at least one nonvolatile memory device and a memory controller controlling the at least one nonvolatile memory device, the method comprising:
receiving a program request;
determining whether to set a timer;
as a consequence of determining to set the timer, setting the timer using a voltage-to-time lookup table and a read voltage when it is necessary to set a timer; and
performing a program operation according to the program request while updating a global time generated from the timer as a time stamp,
wherein the global time comprises an off-time corresponding to a variation in the read voltage until a power is turned on after a power-off.

17. The program method of claim 16, wherein the determination of whether to set the timer is performed based on power-off related information.

18. The program method of claim 16, wherein setting the timer comprises searching for the read voltage.

19. The program method of claim 16, further comprising using a time generated from the timer as the time stamp as a consequence of determining not to set the timer.

20. The program method of claim 16, wherein the time stamp is stored on a page-by-page basis, and wherein the time stamp is stored in a predetermined area of a page in a program operation of the page.

* * * * *